United States Patent [19]

Fischer

[11] Patent Number: 4,799,024
[45] Date of Patent: Jan. 17, 1989

[54] CIRCUIT ARRANGEMENT TO MONITOR THE TIME SPACING OF SIGNALS

[75] Inventor: Helmut Fischer, Munich, Fed. Rep. of Germany

[73] Assignee: Siemens Aktiengesellschaft, Berlin and Munich, Fed. Rep. of Germany

[21] Appl. No.: 21,598

[22] Filed: Mar. 3, 1987

Related U.S. Application Data

[63] Continuation of Ser. No. 636,756, Aug. 1, 1984, abandoned.

[30] Foreign Application Priority Data

Aug. 12, 1983 [DE] Fed. Rep. of Germany ....... 3329242

[51] Int. Cl.[4] .......................... H03K 5/22; H03K 5/153
[52] U.S. Cl. .................................. 328/110; 328/115; 307/359; 307/234
[58] Field of Search ............... 307/517, 518, 263, 268, 307/234, 228, 246, 597, 352, 359, 360; 328/109, 110, 120, 114, 127, 115, 133, 111

[56] References Cited

U.S. PATENT DOCUMENTS

| | | | |
|---|---|---|---|
| 3,371,291 | 2/1968 | Forrest, Jr. et al. | 307/517 |
| 3,395,355 | 7/1968 | Gabor | 328/72 |
| 3,573,493 | 4/1971 | Kamin | 307/234 |
| 3,694,772 | 9/1972 | Sordello | 331/111 |
| 3,831,113 | 8/1974 | Ahmed | 307/228 |
| 3,886,463 | 5/1975 | Caprio | 307/234 |
| 3,947,697 | 3/1976 | Archer et al. | 307/480 |
| 4,092,605 | 5/1978 | Donnelly | 328/155 |
| 4,359,649 | 11/1982 | Mundel | 307/228 |

FOREIGN PATENT DOCUMENTS 0213565  9/1984  German Democratic Rep. ................... 307/517

OTHER PUBLICATIONS

European Patent Office Search Report, File No. RS 67873, dated 23, Dec. 1983.

Primary Examiner—Stanley D. Miller
Assistant Examiner—Timothy P. Callahan
Attorney, Agent, or Firm—Adel A. Ahmed

[57] ABSTRACT

As a function of the occurrence of first square-wave signals the circuit arrangement generates a time window and monitors the appearance of second square-wave signals during the time span defined by the time window. If the second square-wave signals appear during the time window, appropriate output signals are generated. The circuit arrangement contains an integrator which is reset by the first square-wave signals and released subsequently. A comparator compares the voltage at the integrator with two threshold values. If the first threshold valve is exceeded, the time window is opened, and it is reclosed if the second threshold value is exceeded. The threshold values are generated by means of a switchable voltage divider. This voltage divider is switched by means of a flip-flop if the voltage at the integrator exceeds the first or second threshold value, respectively.

25 Claims, 2 Drawing Sheets

CIRCUIT ARRANGEMENT TO MONITOR THE TIME SPACING OF SIGNALS

CROSS-REFERENCE TO RELATED APPLICATION

This is a continuation of Ser. No. 06/636,756, filed Aug. 1, 1984, now abandoned.

BACKGROUND OF THE INVENTION

The invention relates to a circuit arrangement to monitor the time spacing of square-wave signals.

To monitor the time spacing of square-wave signals consisting of first square-wave signals and second square-wave signals appearing between the former it is expedient to generate with each first square-wave a time window which defines an expectancy period for a subsequent corresponding second square-wave signal. It would be imaginable for the generation of the time window to use two monostable flip-flops, the first one marking the beginning and the second one the end of the time window. Such a circuit arrangement is relatively costly and, in particular, because of the relatively great inaccuracies of the internal resistance of monostable flip flops, balancing is required.

SUMMARY OF THE INVENTION

It is one object of the invention to provide a circuit arrangement to monitor the time spacing of square-wave signals which is inexpensive and can be easily produced.

In general, the invention features a circuit arrangement to monitor the time spacing of square-wave signals, in which the square-wave signals contain first square-wave signals and second square-wave signals appearing between the former and in which a timer triggered by a first square-wave signal is provided, wherein an integrator is driven by a constant current source and is discharged after the appearance of the first square signal wave and subsequently charged; a switching stage generates a low first threshold value and a high second threshold value at the beginning and end, respectively, of an expectancy period by a comparator which compares the threshold values with the voltage at the integrator; and an output stage generates output signals if the subsequent second square-wave signal appears during the expectancy period.

In preferred embodiments of the circuit arrangement the output stage includes a flip-flop and an AND gate, the flip-flop is set and reset when the voltage at the integrator exceeds the first or second threshold value, respectively, and the flip-flop transmits a signal assigned to the expectancy period to the switching stage on the one hand and to an AND gate on the other hand, which ties this signal to the second square-wave signals and generates the output signals; the switching stage is designed as a switchable voltage divider, from whose center tap the threshold values are taken; the switching stage, as a two-way switch, includes an integrated, binary logic element whose output transistor stage contains no collector resistor, the function of a collector resistance being assumed by at least one resistor of the voltage divider; the integrator includes a capacitor which is charged by a power source designed as a resistor connected to a voltage source, and discharged by means of a switch through the first square-wave signals; and an integrated, further binary logic element is provided as a said further switch whose output transistor stage has no collector resistance, and the resistor of the constant current source is provided as the collector resistance.

The circuit arrangement according to the invention has the advantage of being able to be constructed very inexpensively. In particular, it can be built inexpensively in the form of a thick film or thin film circuit.

The threshold values are expediently switched by using a switchable voltage divider driven by a logic element without output collector resistance.

The circuit arrangement proves to be especially advantageous when the square-wave signals represent pulses derived from read signals of a disc memory, and particularly read signals representing the servo clock pulses for the positioning of magnetic heads with respect to the storage medium.

Other features and advantages of the present invention will become apparent from the following detailed description, and from the claims.

For a full understanding of the present invention, reference should now be made to the following detailed description and to the accompanying drawings.

DETAILED DESCRIPTION

Figure 1:
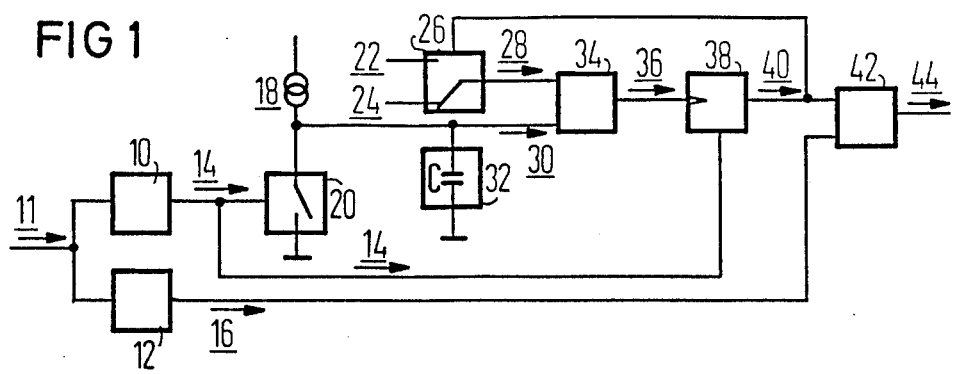
FIG. 1 is a block circuit diagram of the circuit arrangement according to the invention.

The circuit arrangement shown in FIG. 1 contains two evaluating stages 10 and 11 to which are fed an analog input signal 11 and which generate a first square-wave signal 14 and a second square-wave signal 16, respectively. The circuit arrangement also contains an integrator 32 containing a capacitor C which can be charged by a power source 18 and discharged by a switch 20. The capacitor C is discharged with every appearance of a square-wave signal 14. The voltage 30 at the capacitor C is compared in a comparator 34 with a switchable threshold value 28. The threshold value SW is switched from a value 22 to a value 24 and vice versa by means of a switching stage 26. The comparator 34 is followed by an output stage consisting of a flip-flop 38 and an AND gate 42. The output signal 40 of the flip-flop 38 controls the switching stage 26 on the one hand and is fed, on the other hand, to a first input of the AND gate 42, the second input of which carries the square-wave signals 16. At its output, the AND gate 42 emits output signal 44 whenever the square-wave signals 16 appear during a time window generated by means of integrator 32, comparator 34 and flip-flop 38.

Further details of the circuit arrangement are described below together with the time diagrams shown in FIG. 2.

Figure 2:
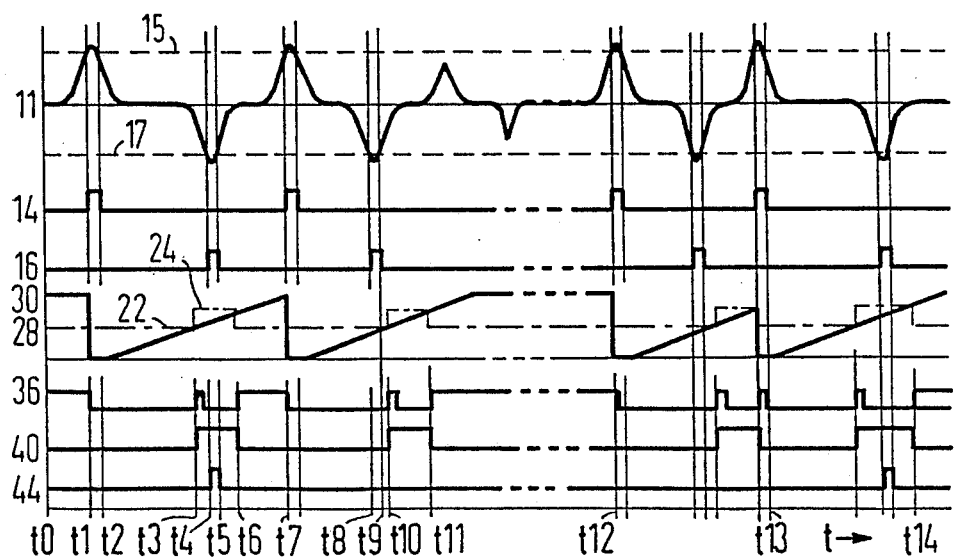
FIG. 2 shows the time diagrams of signals at various points of the circuit arrangement.

In the time diagrams of FIG. 2, the time t is plotted on the abscissa and the signals at various points of the circuit arrangement are shown on the ordinate.

The input signal 11 represents, for instance, read signals when scanning servo clock tracks of a storage disc. The first and second square-wave signals 14 and 16 are generated in the evaluating stages 10 and 12 when the input signals 11 exceeds or fall below specified threshold values 15 and 17, respectively.

It is assumed that capacitor C is charged to its maximum at time t0. The threshold value SW coincides with a lower threshold value 22.

At time t1 the input signal 11 exceeds the threshold value 15 so that a first square-wave signal 14 is generated for the short time span t2-t1. The first square-wave signal 14 closes switch 20 so that capacitor C is discharged very quickly. In addition, first square wave signal switch 14 resets flip-flop 38. The square-wave signal 14 ends at time t2, and switch 20 is reopened so that capacitor C is charged slowly according to a predetermined time constant.

At time t3, the voltage 30 at capacitor C exceeds the threshold value 22 and comparator 34 generates an evaluating signal 36 which sets flip-flop 38. The signal 40 at the output of flip-flop 38 assumes the binary value 1 and connects, in switching stage 26, the threshold value 24 to comparator 34. In addition, the signal 40 defines the expectancy period for the square-wave signals 16. This expectancy period starts at time t3 and ends at time t6 when the voltage 30 exceeds the threshold value 24 and a new evaluating signal 36 is generated in order to reset flip-flop 38. During this expectancy period in the given sample a second square-wave signal 16 appears at time t4 because the input signal 11 falls below 17. This second square-wave signal ends at time t5. It causes an output signal A to be emitted by AND gate 42.

Processes similar to those between times t1 and t6 repeat between the times t7 and t11, except that the second square-wave signal 16 appears too early at time t8 (i.e. before the expectancy period t11-t10) so that no output signal 44 is generated.

The next square-wave signals 14 appear again only at time t12 because the input signal 11 in between t11 and t12 neither exceed nor fall below the threshold values 15 and 17, respectively. Between the times t12 and t13, processes similar to those between the times t7 and t11 repeat, except that here a first square-wave signal 14 appears early at time t13, discharging capacitor C at that time already. No output signal 44 is generated here either because the second square-wave signal 16 does not appear during the expectancy period.

The same processes which occur between the times t1 and t6 repeat between the times t13 and t14, and an output signal 44 is generated again.

Figure 3:
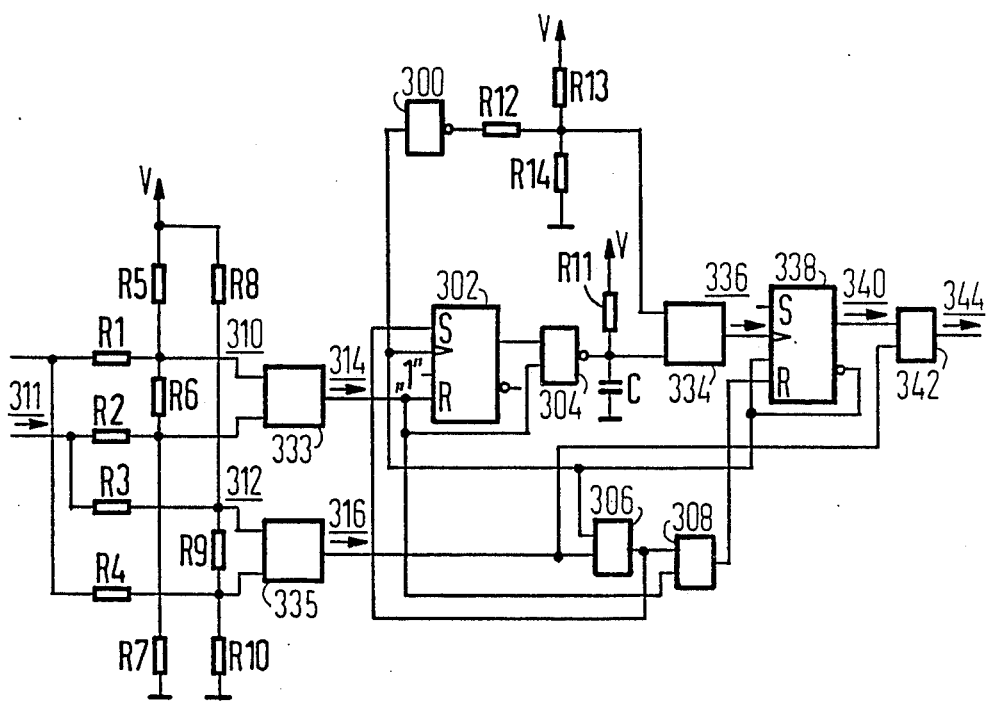
FIG. 3 is a block diagram of an alternate embodiment of the invention.

In the circuit diagram shown in FIG. 3, further comparators 333 and 335 with the resistors R1 through R10 form the two evaluating stages 310 and 312. Provided in addition to the components shown in the block circuit diagram of FIG. 1, are flip-flop 338, AND gate 306, and OR gate 308 which serve the purpose of improving the function even further by resetting the circuit arrangement immediately to its initial state when a second square-wave signal 316 appears, without the signal 340 having assumed the binary value 1. This avoids the erroneous generation of an output signal 344 when, shortly after the appearance of a first square-wave signal 314, several second square-wave signals 316 appear, one of which accidentally coincides timewise with the active signal 340. Also, there is assurance, particularly due to OR gate 308, that always the second square-wave signal 314 arriving last is evaluated as the valid one.

The power source 14 is formed by load resistor R11 connected to voltage source U. Switch 14 is represented by logic element G4 designed as an integrated logic element shown as an inverter whose output transistor has no collector resistance. Instead the function of a collector resistance is also assumed by resistor R11. Switching stage 26 is formed by logic element 300 also shown as an inverter and three resistors R12 through R13. The logic element 300 is likewise designed as an integrated logic element whose output transistor has no collector resistance. The resistors R13 and R14 form a switchable voltage divider, to whose resistors R13 and R14, respectively, resistor R12 alternatively is connected in parallel.

If the expected frequency of recurrence of the input signals 11 permits, the circuit arrangement may also be constructed exclusively of digital components. In that case, integrator 32 is formed of a counter driven by a clock of appropriate high frequency. The threshold values 22 and 24 then correspond to specified counts. The comparator 34 corresponds to a digital comparator which constantly compares the count indicated by the counter with the respectively specified count. The switch 20 corresponds, for example, to a counter input, by means of which the latter is reset to a preset initial value. In the claims, the terms "actuate" and "deactuate" shall be used to describe functions associated with the integrator I and shall include but not be limited to include the resetting and release of an integrator, the charging and discharging of a capacitor serving as an integrator and the incrementing or driving and decrementing or resetting of a counter serving as an integrator, respectively.

A circuit arrangement so designed has the advantage of being producible entirely as an integrated circuit and being adaptable to various conditions by simply varying the counting clock frequency and counts to be specified.

There has thus been shown and described a novel circuit arrangement to monitor the time spacing of square-wave signals which fulfills all the objects and advantages sought therefor. Many changes, modifications, variations and other uses and applications of the subject invention will, however, become apparent to those skilled in the art after considering the specification and the accompanying drawings which disclose embodiments thereof. All such changes, modifications, variations and other uses and applications which do not depart from the spirit and scope of the invention are deemed to be covered by the invention which is limited only by the claims which follow.

What is claimed is:

1. A circuit arrangement to monitor the time spacing of first and second square-wave input signals exhibiting respective first and second levels, wherein said second square-wave input signal exhibits said first level when said first square-wave input signal exhibits said second level, said circuit arrangement including switch means responsive to said first square-wave and coupled between a constant current source and ground and including a capacitor coupled to said constant current source such that said capacitor is respectively not charged and charged by said constant current source responsive to said first square-wave input signal exhibiting said respective first level and said first square-wave input signal exhibiting a transition from said respective first level to said respective second level, the circuit arrangement further comprising:

a switching stage for generating a first threshold value and a second threshold value representative of the beginning and end, respectively, of an expectancy period or time interval of an expected level of the second square wave input signal;

a comparator having an output, having a first input coupled to an output of the switching stage, and having a second input coupled to said capacitor for comparing the generated threshold values with the charge level of said capacitor and for generating at said output of said comparator a signal representative of said comparing; and an output stage, coupled to receive the output of said comparator and said second square wave input signal, for generating an output signal when said second square wave input signal exhibits said first level during the expectancy period.

2. The circuit arrangement according to claim 1, wherein the output stage comprises a flip-flop and AND gate, the flip-flop having a control input coupled to said comparator and being set and reset when the output of the integrator exceeds the generated first or second threshold value, respectively, said flip-flop providing a control signal having a duration corresponding to the expectancy period for controlling the switching stage, and for further providing said control signal to a first input of the AND gate the second square-wave signal being provided to a second input of the AND gate, said AND gate generating the output signal.

3. The circuit arrangement according to claim 1, wherein the switching stage comprises a switchable voltage divider, from whose tap the first and second threshold values are generated.

4. The circuit arrangement according to claim 3, wherein the switching stage further comprises a two position switch, coupled to said switchable voltage divider, said switch comprising an integrated, binary logic element whose output transistor stage contains substantially no inherent collector resistance, the function of the collector resistance being assumed by at least one resistor of the switchable voltage divider.

5. The circuit arrangement according to claim 1, wherein the switch means comprises an integrated, binary logic element including an output transistor stage having negligibly small inherent collector resistance, and wherein the resistance of the constant current source functions as the collector load resistance.

6. A circuit arrangement for monitoring a predetermined time relationship between first and second square-wave signals, said square-wave signals each exhibiting respective first and second logic levels with respective transitions therebetween, said circuit arrangement comprising:

first and second input points for receiving said first and second square-wave signals, respectively;
an output point;
selectively operable integrating circuit means having a control input coupled to said first input point and being responsive to said first square-wave signal for providing an integration signal, said integration signal having a reference level when said first square-wave signal exhibits said respective first logic level and having an integration-time representative level when said first square-wave signal exhibits said respective second logic level, said integration-time representative level beginning at said reference level when said first square-wave signal exhibits a transition from said respective first to said respective second logic level; and
controllable switching circuit means coupled to said second input point and said output point, having a control input coupled to said integating circuit means, and being responsive to said integration signal for providing at said output point an output signal having first and second output levels and exhibiting said first output level only when said second square-wave signal exhibits a predetermined one of said respective first and second logic levels at a time when said integration signal level is within a predetermined range.

7. The circuit arrangement recited in claim 6, wherein said integrating circuit means includes:

a controllable current supply; and
capacitance means coupled to said controllable current supply for providing said integration signal exhibiting said integration-time representative level.

8. The circuit arrangement recited in claim 7, wherein said controllable switching circuit includes:

controllable threshold means for selectably providing a comparison signal having one of first and second threshold potential levels defining said predetermined range therebetween; and
comparator means for comparing said integration signal with said comparison signal.

9. The circuit arrangement recited in claim 8, wherein said controllable switching circuit includes:

an AND gate having a first input coupled to said second input point, an output coupled to said output point for providing said output signal, and a second input; and
a flip-flop having a control input coupled to said comparator for being set and reset when said integration signal exceeds said first and second threshold potential levels, respectively, and having an output coupled to said second input of said AND gate and to said controllable threshold means for selecting one of said first and second threshold potential levels.

10. The circuit arrangement recited in claim 9, wherein said controllable threshold means includes switchable voltage divider means.

11. The circuit arrangement recited in claim 10, wherein said controllable threshold means includes two-way switch means for selecting one of said first and second threshold potentials, said switch means comprising an integrated binary logic element including a transistor output stage having a collector resistance solely comprising said voltage divider means.

12. The circuit arrangement recited in claim 6, wherein said selectively operable integrating circuit means includes:

a source of energizing potential;
capacitance means;
resistance means coupled between said source and said capacitance means for providing charging current; and
switch means coupled to said first input point and to said capacitance means for selectively discharging said capacitance means responsive to said first square-wave signal.

13. The circuit arrangement recited in claim 12, wherein said controllable switching circuit means includes:

controllable threshold means for selectably providing a comparison signal having one of first and second threshold potential levels defining said predetermined range therebetween; and comparator means for comparing said integration signal with said comparison signal.

14. The circuit arrangement recited in claim 13, wherein said controllable switching circuit includes:
an AND gate having a first input coupled to said second input point, an output coupled to said output point for providing said output signal, and a second input; and
a flip-flop having a control input coupled to said comparator for being set and reset when said integration signal exceeds said first and second threshold potential levels, respectively, and having an output coupled to said second input of said AND gate and to said controllable threshold means for selecting one of said first and second threshold potential levels.

15. The circuit arrangement recited in claim 14, wherein said controllable threshold means includes switchable voltage divider means.

16. The circuit arrangement recited in claim 15, wherein said controllable threshold means includes two-way switch means for selecting one of said first and second threshold potentials, said switch means comprising an integrated binary logic element including a transistor output stage having a collector resistance solely comprising said voltage divider means.

17. The circuit arrangement recited in claim 6, further including signal processing means having an input terminal for receiving an input signal and having first and second outputs coupled to said first and second input points for providing said first and second square-wave signals thereto, respectively.

18. The circuit arrangement recited in claim 17, wherein said signal processing means includes:
first threshold means coupled between said input terminal and said first output for providing said respective first and second logic levels of said first square-wave signal when said input signal exceeds and does not exceed a first signal threshold level, respectively; and
second threshold means coupled between said input terminal and said second output for providing said respective first and second logic levels of said second square-wave signal when said input signal exceeds and does not exceed a second signal threshold level, respectively.

19. The circuit arrangement recited in claim 18, wherein said integrating circuit means includes:
a controllable current supply; and
capacitance means coupled to said controllable current supply for providing said integration signal exhibiting said integration-time representative level.

20. The circuit arrangement recited in claim 19, wherein said controllable switching circuit includes:
controllable threshold means for selectably providing a comparison signal having one of first and second threshold potential levels defining said predetermined range therebetween; and
comparator means for comparing said integration signal with said comparison signal.

21. The circuit arrangement recited in claim 20, wherein said controllable switching circuit includes:
an AND gate having a first input coupled to said second input point, and output coupled to said output point for providing said output signal, and a second input; and
flip-flop having a control input coupled to said comparator for being set and reset when said integration signal exceeds said first and second threshold potential levels, respectively, and having an output coupled to said second input of said AND gate and to said controllable threshold means for selecting one of said first and second threshold potential levels.

22. The circuit arrangement recited in claim 21, wherein said controllable threshold means includes switchable voltage divider means.

23. The circuit arrangement recited in claim 22, wherein said controllable threshold means includes two-way switch means for selecting one of said first and second threshold potentials, said switch means comprising an integrated binary logic element including a transistor output stage having a collector resistance solely comprising said voltage divider means.

24. The circuit arrangement recited in claim 17, wherein said selectively operable integrating circuit means includes:
a source of energizing potential;
capacitance means;
resistance means coupled between said source and said capacitance means for providing charging current; and
switch means coupled to said first input point and to said capacitance means for selectively discharging said capacitance means responsive to said first square-wave signal.

25. The circuit arrangement recited in claim 24, wherein said controllable switching circuit means includes:
controllable threshold means for selectably providing a comparison signal having one of first and second threshold potential levels defining said predetermined range therebetween; and
comparator means for comparing said integration signal with said comparison signal.

* * * * *